(12) United States Patent  
Flaherty et al.

(10) Patent No.: US 7,081,644 B2  
(45) Date of Patent: Jul. 25, 2006

(54) OVERMOLDED LENS ON LEADFRAME AND METHOD FOR OVERMOLDING LENS ON LEAD FRAME

(75) Inventors: Edward M. Flaherty, New Milford, CT (US); Timothy A. Butkus, Naugatuck, CT (US)

(73) Assignee: Barnes Group Inc., Bristol, CT (US)

( * ) Notice: Subject to any disclaimer, the term of this patent is extended or adjusted under 35 U.S.C. 154(b) by 0 days.

(21) Appl. No.: 10/852,877

(22) Filed: May 25, 2004

(65) Prior Publication Data

US 2005/0174767 A1    Aug. 11, 2005

Related U.S. Application Data

(60) Provisional application No. 60/542,561, filed on Feb. 6, 2004.

(51) Int. Cl.  
*H01L 33/00* (2006.01)

(52) U.S. Cl. .......................... 257/98; 257/100

(58) Field of Classification Search ............... 362/227, 362/182, 226, 311, 800; 257/98, 100; 313/118, 313/112, 512  
See application file for complete search history.

(56) References Cited

U.S. PATENT DOCUMENTS

| | | | |
|---|---|---|---|
| 5,036,244 A | 7/1991 | Shaffer | |
| 6,204,523 B1 | 3/2001 | Carey et al. | |
| 6,274,924 B1 | 8/2001 | Carey et al. | |
| 6,428,650 B1 | 8/2002 | Chung | |
| 6,541,800 B1 * | 4/2003 | Barnett et al. | 257/98 |
| 6,590,235 B1 * | 7/2003 | Carey et al. | 257/98 |
| 6,827,468 B1 * | 12/2004 | Galli | 362/294 |
| 6,903,380 B1 * | 6/2005 | Barnett et al. | 257/98 |

* cited by examiner

*Primary Examiner*—Ali Alavi  
(74) *Attorney, Agent, or Firm*—Fay, Sharpe, Fagan, Minnich & McKee, LLP

(57) ABSTRACT

A light emitting diode (LED) assembly including an LED, an optically transmissive cover and a base for supporting the LED. The optically transmissive cover encapsulates the LED and includes a stiffener for reinforcing a base portion of the cover. The base includes electrical leads extending therefrom that are electrically connected to the LED. To make the cover, at least one support frame is formed in a strip of substantially rigid material. The at least one support frame is connected to a processing portion of the strip. At least one lens is overmolded on the at least one support frame that is connected to the processing portion. The overmolded support frame is removed from the processing portion of the strip.

21 Claims, 8 Drawing Sheets

US 7,081,644 B2

OVERMOLDED LENS ON LEADFRAME AND METHOD FOR OVERMOLDING LENS ON LEAD FRAME

This application claims priority from U.S. Provisional Patent Application Ser. No. 60/542,561 filed on Feb. 6, 2004 and is expressly incorporated herein by reference.

BACKGROUND OF THE INVENTION

1. Field of the Invention

The present invention relates to light emitting diode (LED) technology and, more particularly, to a lens cover for an LED. The present invention finds particular application as a reinforced lens cover and a method of manufacturing said reinforced lens cover and will be described with particular reference thereto. However, it is to be appreciated that the present invention may relate to other similar environments and applications.

2. Discussion of the Art

An LED assembly generally includes a base, an LED supported by the base and a cover over the LED. The LED is typically a piece of semiconductor material having wire leads extending therefrom for delivering current to the LED. The cover is typically a substantially transparent material having a dome shape and acting as a lens for light emitted from the LED. When assembled, the cover and the base serve to encapsulate the LED and protect it from adverse environmental effects. The optically transmissive cover additionally serves to enhance light emission from the LED and control external radiation patterns from the LED.

Several design aspects are involved in providing a suitable cover for an LED. The cover should be sufficiently rigid to provide a structurally sound member. Moreover, the cover should be at least partially substantially transparent and minimize the amount of light attenuation so as to not adversely affect the spectrum of light which is emitted by the LED, particularly as the cover ages. Heretofore, these design aspects often competed with one another, i.e., an improvement in one of the aspects often corresponded to a weakening in another of the aspects.

LED covers that attempted to balance the design aspects were often difficult to manufacture. For example, one type of conventional cover is formed in two parts. The two-part cover typically includes a hard outer shell and a soft resilient inner shell, often formed of silicone, defining a space therein for the LED substrate. The hard outer shell of the two part cover enables it to be structurally sound while the soft inner shell reduces the likelihood that the LED substrate will be damaged. One drawback of the two-part cover is that the hard outer shell often has low heat characteristics. Thus, there is a need for an LED cover that balances the design aspects discussed above while being relatively easy to manufacture.

SUMMARY OF THE INVENTION

The present invention provides a new and improved lens assembly that overcomes the foregoing difficulties and others and provides the aforementioned and other advantageous features. More particularly, in accordance with one aspect of the invention, a lens cover for a light emitting diode is provided. In accordance with this aspect of the invention, the lens cover includes a base portion, a dome portion and a support frame reinforcing the base portion for providing structural integrity to the lens cover.

In accordance with another aspect of the invention, a leadframe strip assembly is provided for LED lens assemblies having lenses and rigid support frames for structurally supporting said lenses. More particularly, in accordance with this aspect of the invention, the leadframe strip assembly includes a leadframe strip and at least one support frame disposed within the leadframe strip. At least one lens is overmolded onto the at least one support frame.

In accordance with still another aspect of the invention, a light emitting diode (LED) assembly is provided. More particularly, in accordance with this aspect of the invention, the LED assembly includes an LED, an optically transmissive cover and a base for supporting the LED. The optically transmissive cover encapsulates the LED and includes a stiffener for reinforcing a base portion of the cover. The base has electrical leads extending therefrom that are electrically connected to the LED.

In accordance with still yet another aspect of the invention, a method of manufacturing an LED cover assembly is provided. More particularly, in accordance with this aspect of the invention, a strip of substantially rigid material is provided. At least one support frame is formed in the strip that is connected to a processing portion of the strip. At least one lens is overmolded on the at least one support frame that is connected to the processing portion. The overmolded support frame is removed from the processing portion of the strip.

BRIEF DESCRIPTION OF THE DRAWINGS

The invention may take form in various components and arrangements of components and in various steps and arrangements of steps. The drawings are only for purposes of illustrating one or more preferred embodiments and are not to be construed as limiting the invention.

DETAILED DESCRIPTION OF THE PREFERRED EMBODIMENT(S)

Figure 10:
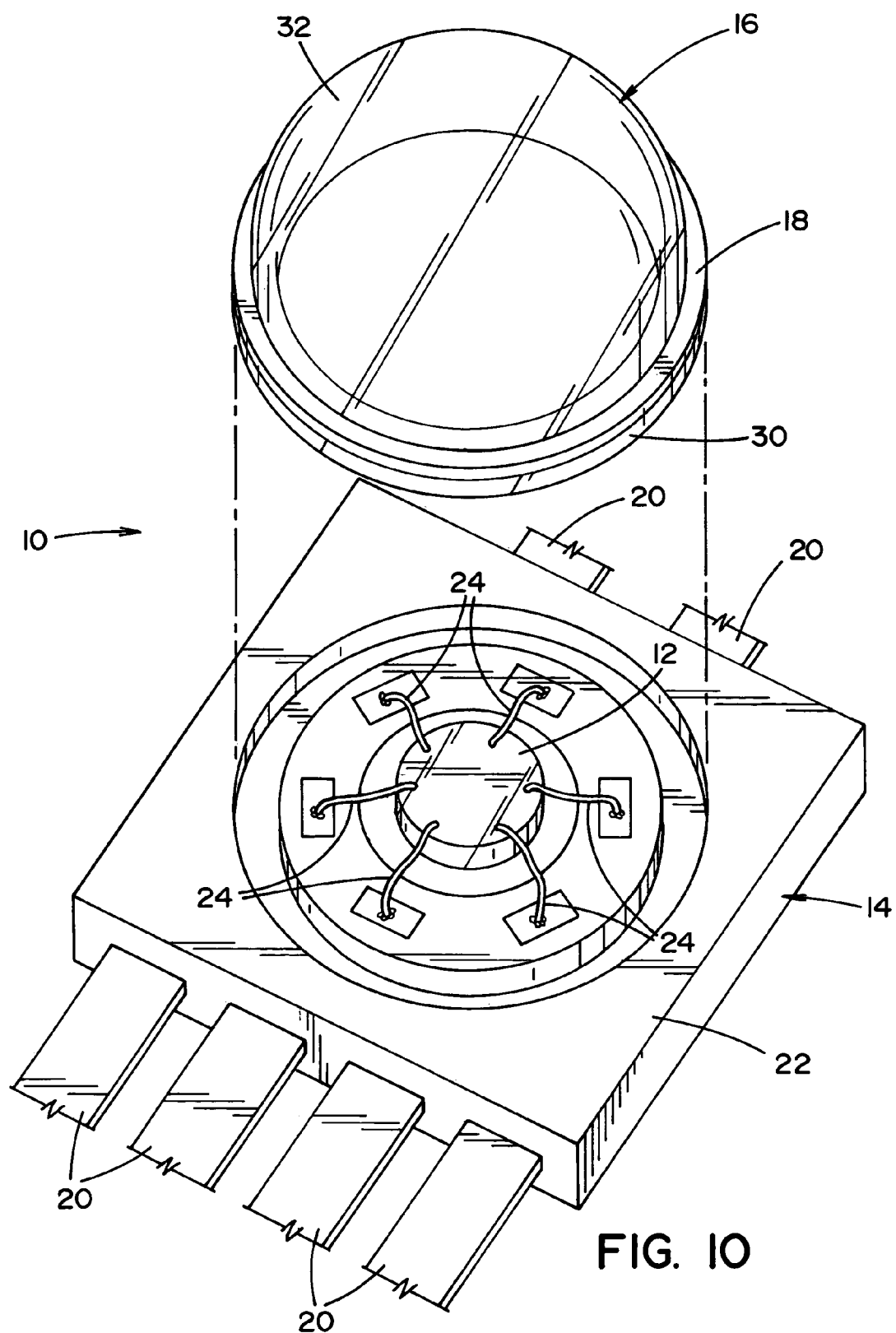
FIG. 10 is a light emitting diode (LED) assembly including the lens assembly of FIG. 1.

Referring now to the drawings wherein the showings are for purposes of illustrating one or more preferred embodiments of the invention only and not for purposes of limiting the same, FIG. 10 shows a light emitting diode (LED) assembly generally designated by reference numeral 10 in accordance with one preferred embodiment. The LED assembly generally includes an LED 12 supported on a base 14 and encapsulated by a cover or lens assembly 16. The cover 16 is optically transmissive and/or at least partially substantially transparent for allowing light emitted by the LED to pass therethrough. As will be discussed in more detail below, the cover 16 includes a stiffener 18, also referred to herein as a support frame, that provides structural rigidity to the cover 16.

The base 14 includes electrical leads 20 extending therefrom that are electrically connected to the LED 12 for providing an electrical current thereto. More specifically, leads 20 extend through a body 22 of the base and are electrically connected to the LED 12 by bond wires 24. When an appropriate electrical current is supplied through the leads 20 and the bond wires 24, the LED 12 emits a light that passes through the cover 16. The cover 16 serves to protect the LED 12 from the environment in which the LED is deployed.

Figure 1:
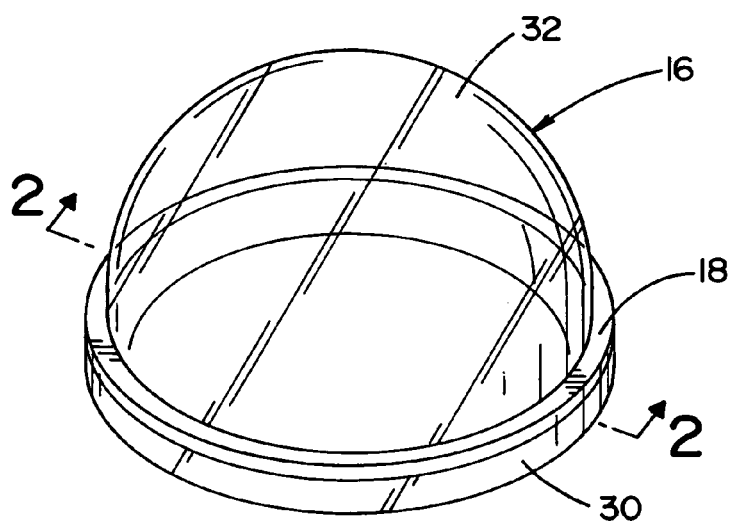
FIG. 1 is a perspective view of a lens assembly having a dome extending from a base and a support frame annularly disposed about the dome on the base in accordance with one embodiment of the invention.
Figure 2:
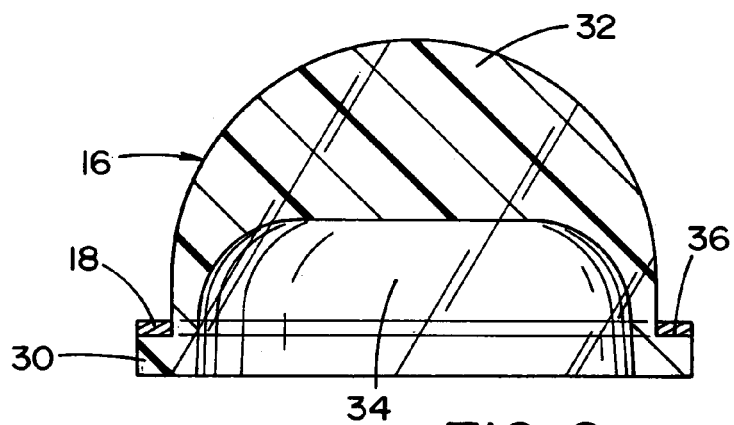
FIG. 2 is a cross-sectional view of the lens assembly taken at line 2—2 of FIG. 1.

With additional reference to FIGS. 1 and 2, the cover 16 is formed of a soft and/or resilient material that forms an annular base portion 30 and a dome portion 32 extending from the base portion. The dome portion 32 acts as a lens for collimating light from the LED 12. Within the portions 30,32, the cover 16 defines an LED cavity 34 for receiving the LED 12. The support frame 18 is disposed with the base portion 30 and reinforces the base portion 30 to provide structural integrity to the cover 16. In particular, the support frame 18 has the benefit of adding dimensional stability to the cover 16. Moreover, as will be described in more detail below, the support frame 18 allows the cover 16 to be more easily handled, particularly when the cover 16 is assembled as part of an LED assembly. In the illustrated embodiment, the support frame 18 is a ring positioned adjacent the base portion 30. More specifically, as will be described in more detail below, the base portion 30 is overmolded onto the support frame 18 such that the support frame is oriented on a side 36 of the base portion 30 adjacent the dome portion 32. In the preferred embodiments described herein, the cover 16 is formed of a silicone or like material and the support frame 18 is formed of a stainless steel or similar material.

Figure 3:
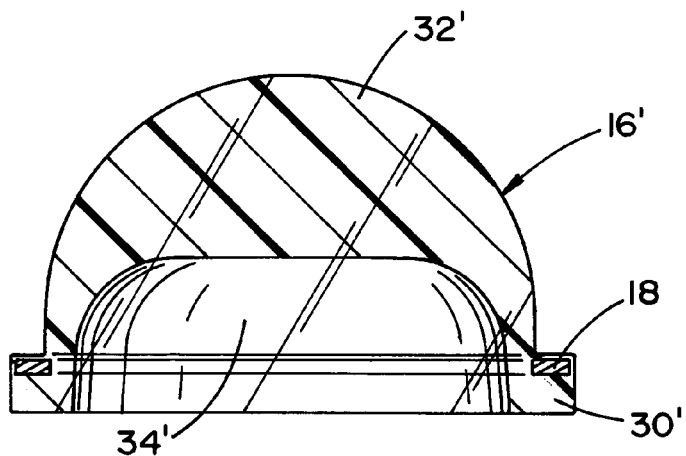
FIG. 3 is a cross-sectional view of a lens assembly having a dome extending from a base and a support ring encased in the base in accordance with another embodiment of the invention.

With reference to FIG. 3, an alternate cover 16' is shown including a base portion 30' and a dome portion 32' extending from the base portion. The cover 16' is optionally used in place of the cover 16 in the LED assembly 10. Like the dome portion 32, the dome portion 32' acts as a lens for collimating light from the LED. An LED cavity 34' is defined in the cover 16' to receive the LED. The cover 16' includes the support frame 18 disposed with the base portion 30' for reinforcing the base portion to provide structural integrity to the cover 16'. However, the support frame 18 is positioned within the base portion 30', i.e., the support frame 18 is encased in or by the base portion 30'. Like the cover 16, the base portion 30' is overmolded onto the support frame 18. However, the support frame 18 is oriented within or imbedded in the base portion 30'. In most other respects, the cover 16' is like the cover 16.

Figure 4:
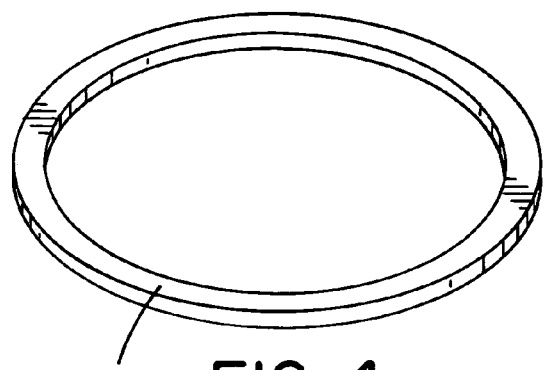
FIG. 4 is a perspective view of the support frame.

With reference to FIG. 4, the support frame 18 is shown as a flat ring or washer-like structure. In the illustrated embodiments discussed herein, the support frame 18 is a single component that is annular-shaped and generally matches the shape of the base portion (30 or 30') of the lens cover (16 or 16'). However, it is to be understood by those skilled in the art that the base portion could have an alternate shape (oval, rectangular, etc.) and the frame 18 could be modified to match or complement such an alternate shape. In addition, it also to be understood by those skilled in the art that the support frame 18 could be formed of more than a single piece and/or could have a shape that varies from that of the base portion. The purpose of the support frame 18 is to provide rigidity to the base portion which will improve the structural integrity of the cover.

Figure 6:
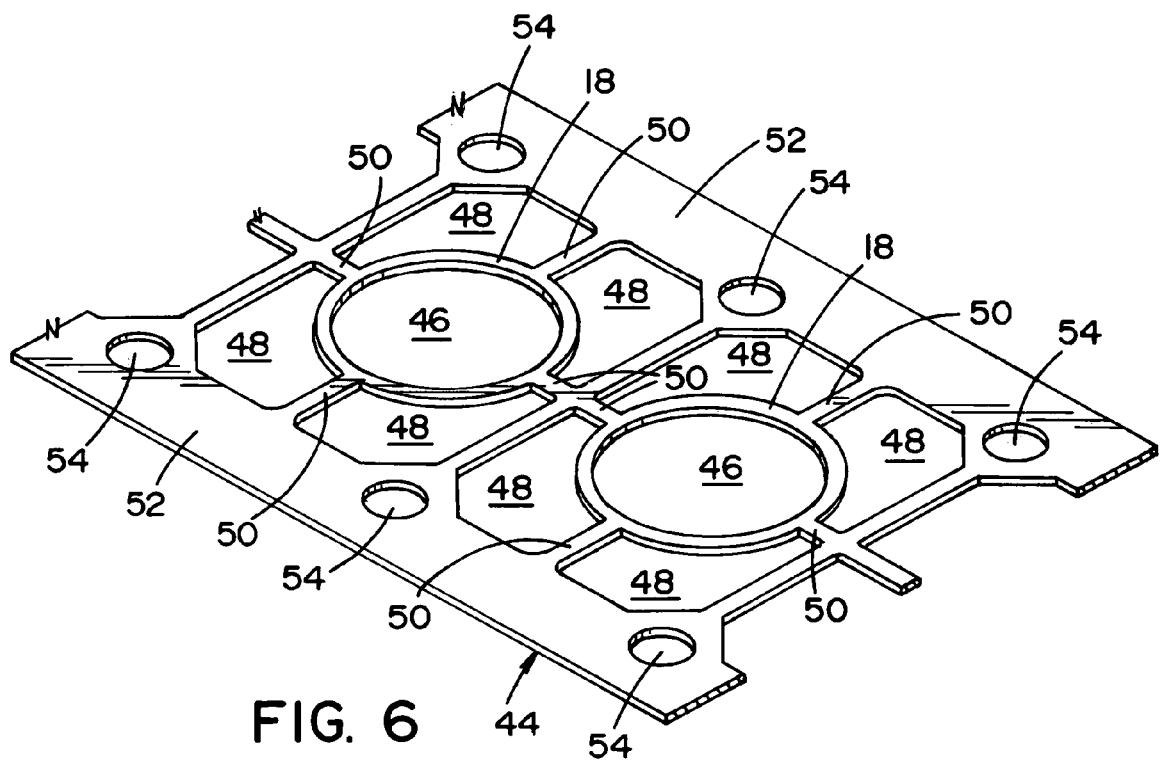
FIG. 6 is a partial perspective view of the roll of leadframe material taken along the line 6—6 of FIG. 5 showing support frames formed therein by the metal punch.
Figure 5:
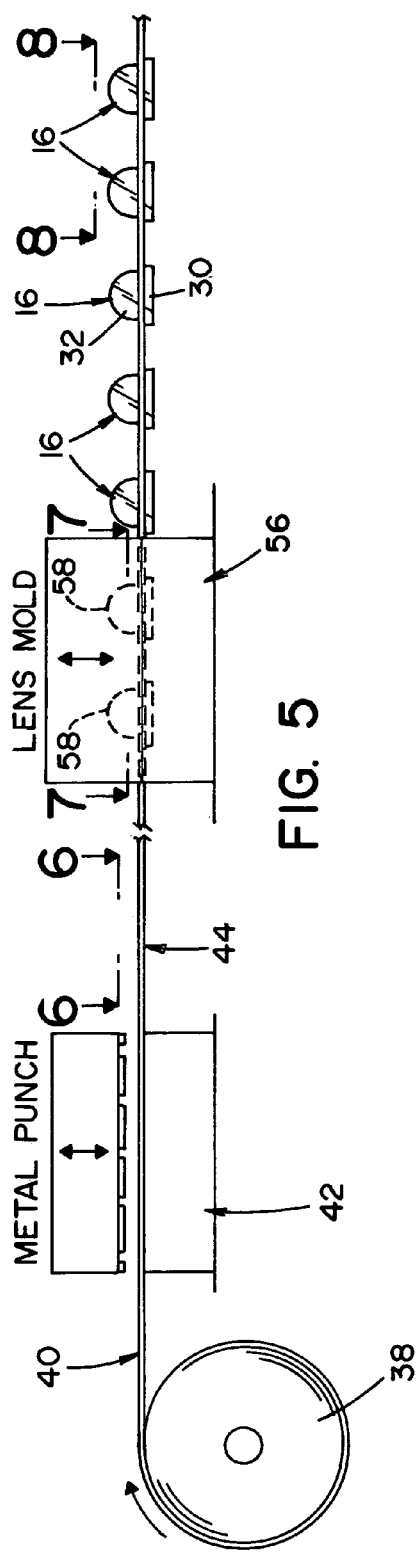
FIG. 5 is a partial schematic view of a roll of leadframe material and apparatus (a metal punch and a lens mold) for forming a plurality of lens assemblies in accordance with an embodiment of the invention.

With reference to FIG. 5, a roll 38 of leadframe material 40 that is relatively rigid is used to form a plurality of support frames 18 which are overmolded with a lens material to form a plurality of covers. More particularly, the roll 38 of leadframe material 40, which in the preferred embodiments is stainless steel but can alternatively be formed of another metal, a plastic or other suitable structural material or substrate, is unrolled and fed through a metal punch apparatus 42 which functions to shear or cut the leadframe material 40 into the partial leadframe strip 44 shown in FIG. 6. Specifically, the punch apparatus 42 removes leadframe material from inner cavities or areas 46 to form inner diameters of the plurality of support frames 18. Around each of the support frames 18, the punch apparatus 42 removes leadframe material from outer cavities or areas 48 to form outer diameters of the support frames 18 and a plurality of supports 50. The supports 50 connect the support frames 18 to a remaining or processing portion 52 of the leadframe material 40 and maintain the position and orientation of the support frames 18 as the leadframe material 40 is further processed. The punch apparatus 42 also forms a plurality of pin or guide holes 54, also referred to herein as recesses, in the processing portion 52 which can be used for holding and/or positioning the unrolled portion of the leadframe material 40 during further processing thereof. In a preferred embodiment, the leadframe material 40 can vary in type, thickness and width pending specific applications.

Figure 7:
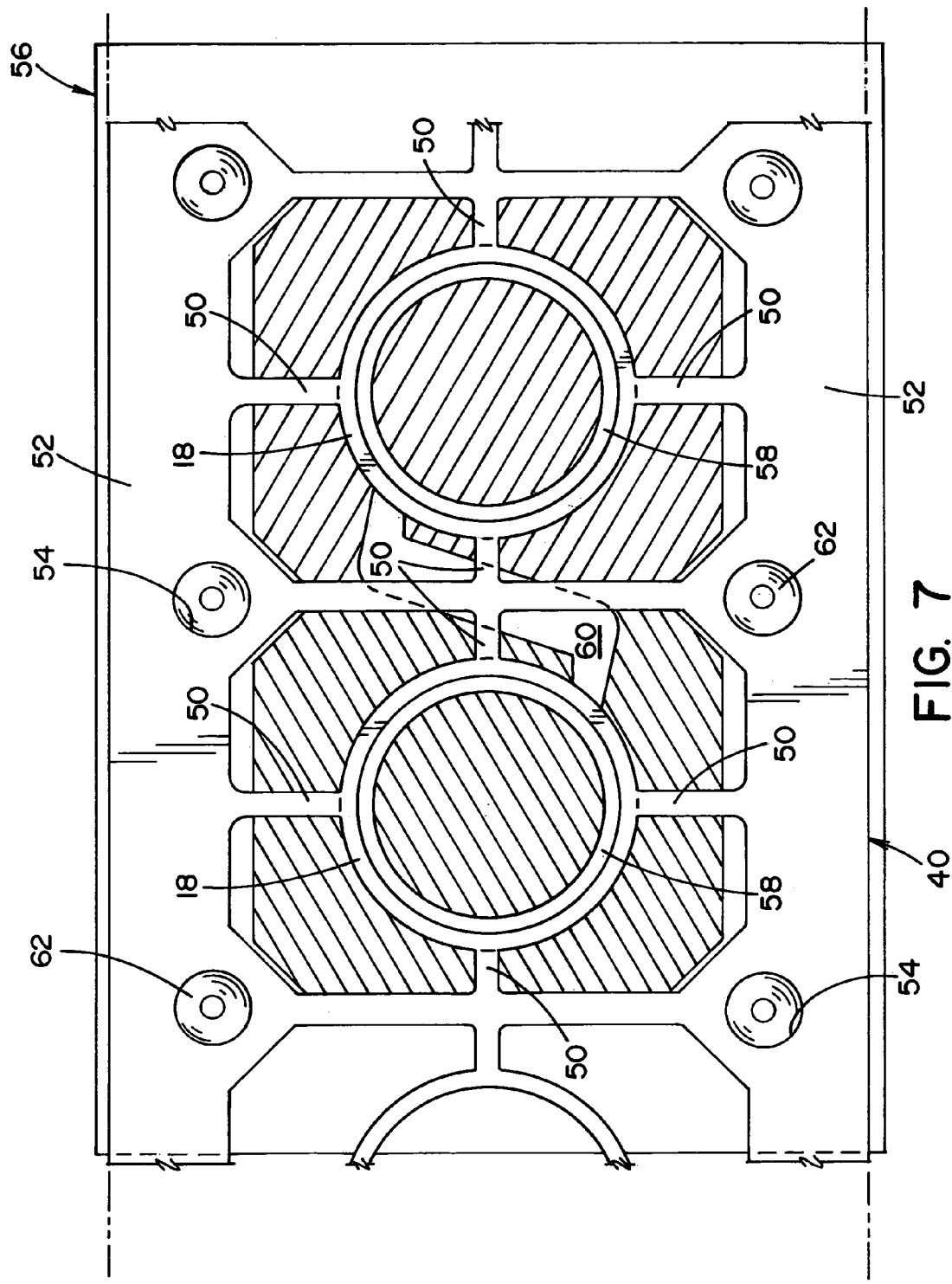
FIG. 7 is a partial plan view of the leadframe material taken along the line 7—7 of FIG. 5 showing the leadframe material in the lens mold.

Next, the punched leadframe material 40 is fed or delivered to a lens mold apparatus 56. Although the leadframe material 40 is shown as being directly fed from the punch apparatus 42 to the lens mold apparatus 56, the punched material 40 could be collected and later unrolled for feeding into the lens mold apparatus 56. With additional reference to FIG. 7, the lens molding apparatus 56 closes on the unrolled leadframe material 40 and forms a molding cavity 58 about each support frame 18. In the preferred embodiment, as shown in FIG. 5, molding cavities 58 are formed around support frames 18 in the lens molding apparatus 56. Each of the mold cavities 58 includes a base cavity portion for forming the base portion 30 and a dome cavity portion for forming the dome portion 32.

Through a sprue (not shown) connected to a runner section 60 that conveys material with the cavities 58, silicone material, also referred to herein as a liquid silicone rubber (LSR), is delivered to the molding cavities 58 and is overmolded onto or with the support frames 18. In the illustrated embodiment, the molding cavities 58 are positioned relative to the support frames 18 such that the base cavity portions are adjacent the support frames 18 and overmolding causes the silicone base portion to form adjacent the support frames 18. In an alternate embodiment, the molding cavities are positioned relative to the support frames 18 such that the base cavity portions are positioned around the support frames 18 and overmolding causes the silicone base portion to encase the support frames 18 such that the support frames 18 become embedded in their respective base portions 30. The holes 54 in the processing portion 52 receive pins 62 of the lens mold apparatus 56 for purposes of aligning the support frames 18 with and relative to the mold cavities 58.

Figure 8:
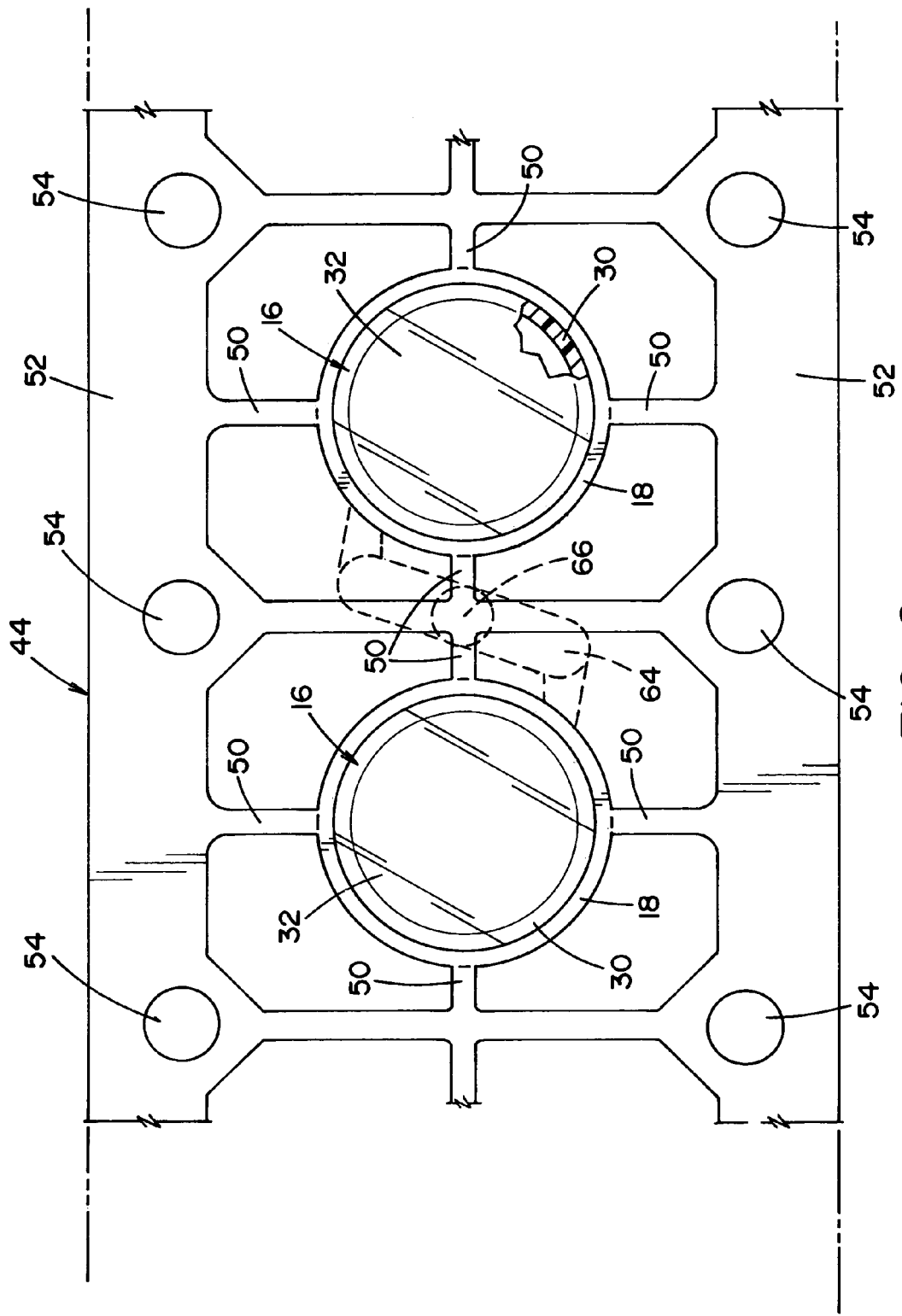
FIG. 8 is a partial plan view of the leadframe material taken along the line 8—8 of FIG. 5 showing lenses overmolded on the support frames.
Figure 9:
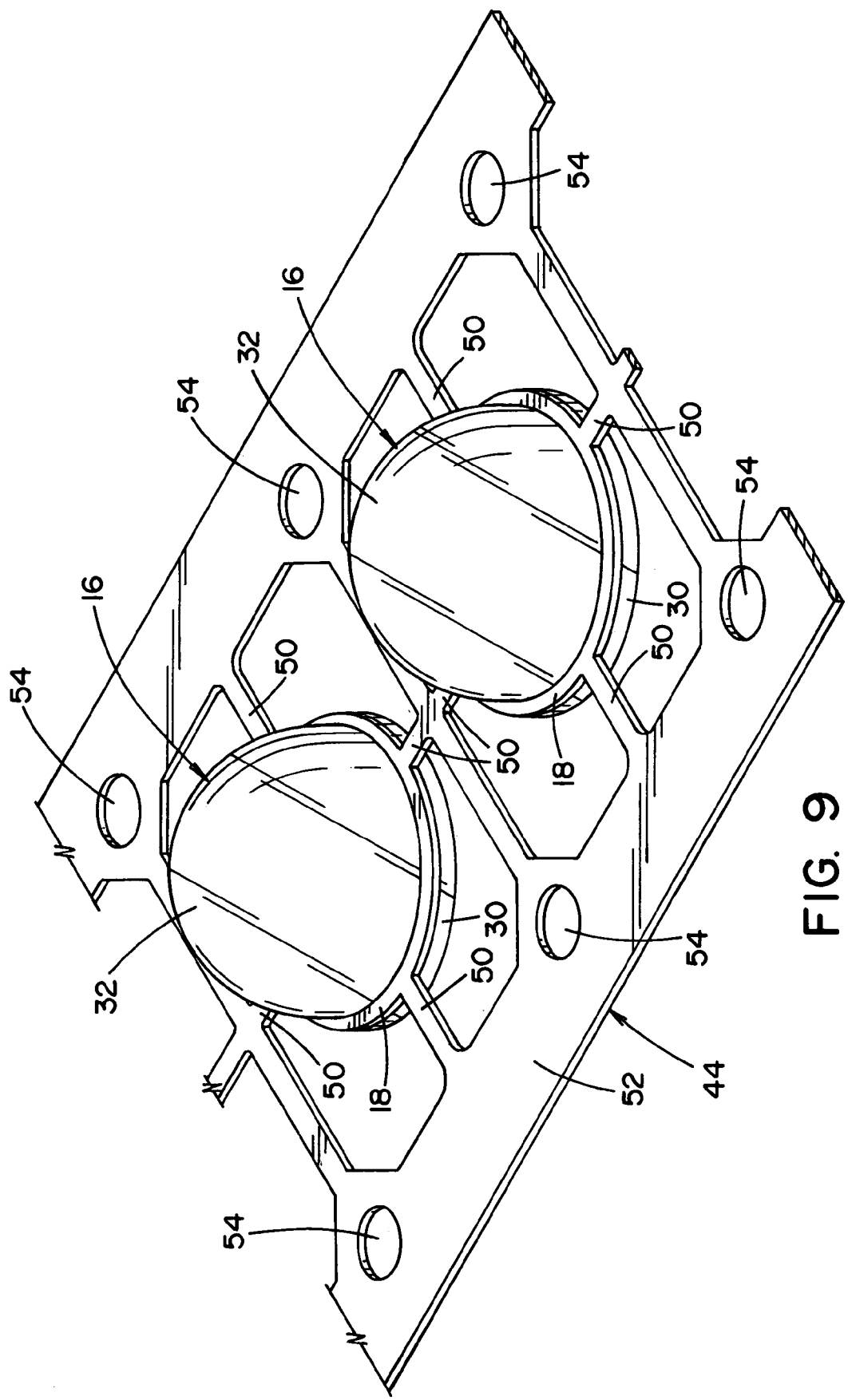
FIG. 9 is a partial perspective view of the overmolded lenses on the support frames of the leadframe material of FIG. 8.

After delivery, the silicone material is allowed to cure to form the cover 16 including base portion 30 adjacent the support frame 18 and dome portion 32 extending through the support frame 18 from the base portion 30. After sufficient curing time, the overmolded support frames 18 and their corresponding processing portion 52 of leadframe material 40 are removed from the lens mold apparatus 56. With reference to FIGS. 8 and 9, the support frames 18 are overmolded with covers 16 that are connected to one another by cured silicone material 64,66 (not shown in FIG. 9) that is removed from the runner section 60 and the sprue. The overmolded support frames 18 are still connected to the processing portion 52 by the supports 50. The covers or lenses 16 each include the base portion 30 formed adjacent and below the support frames 18 and the dome portion 32 protruding through the support frames 18.

Figure 11:
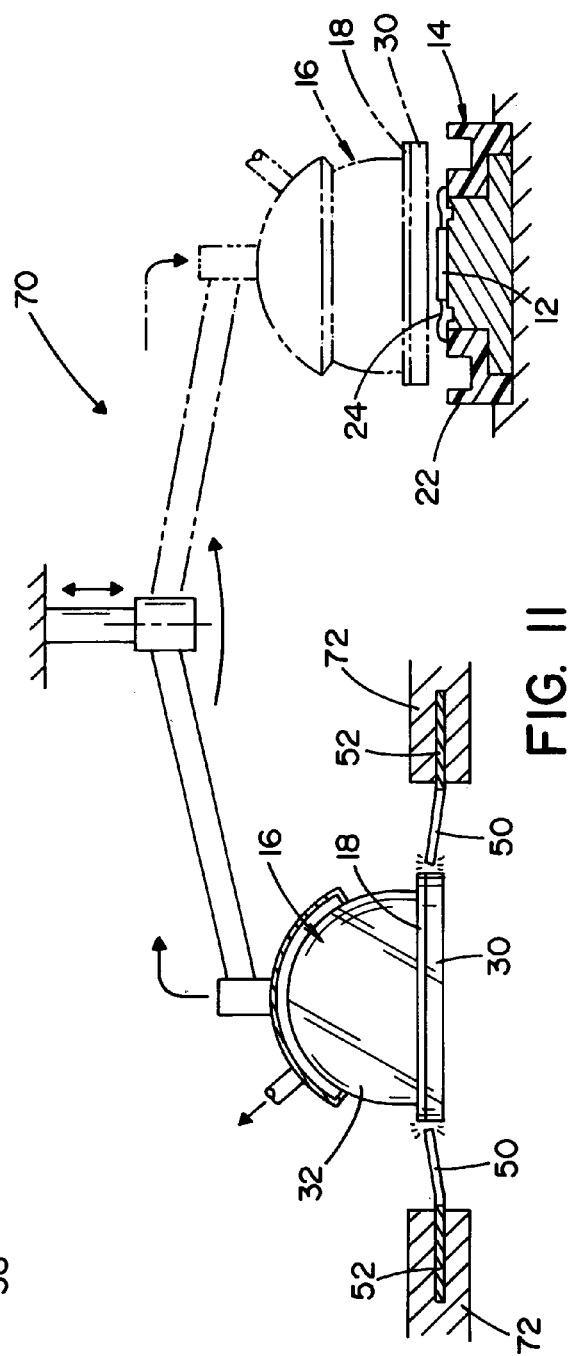
FIG. 11 is a partial cross-sectional schematic view of a vacuum pick and place apparatus for removing a single lens assembly from the leadframe material and encapsulating an LED with the lens assembly by placing the lens assembly on an LED base.

The unrolled and overmolded leadframe material 40 can optionally be cut into strips 44 of various lengths for purposes of packing and/or moving thereof. Strips 44 enable sections of the leadframe material to be stacked or otherwise maneuvered. After separation into strips or as a continuation of the processing shown in FIG. 5, each overmolded support frame 18 can be removed from its processing portion 52. In accordance with one embodiment, with reference to FIG. 11, a vacuum pick and place apparatus 70 is used to remove each overmolded support frame 18 with its cover 16. As illustrated, the apparatus 70 separates each cover 16 and its support frame 18 from the supports 50. While holding the cover and frame 16,18, the apparatus 70 then rotates the cover and frame to an appropriate position and places the cover 16 on a base 14 with an LED 12 to encapsulate the LED 12. The apparatus 70 can include appropriate gripping or positioning members 72 to hold the processing portion 52 in place while each cover 16 and its frame 18 are removed.

Figure 12:
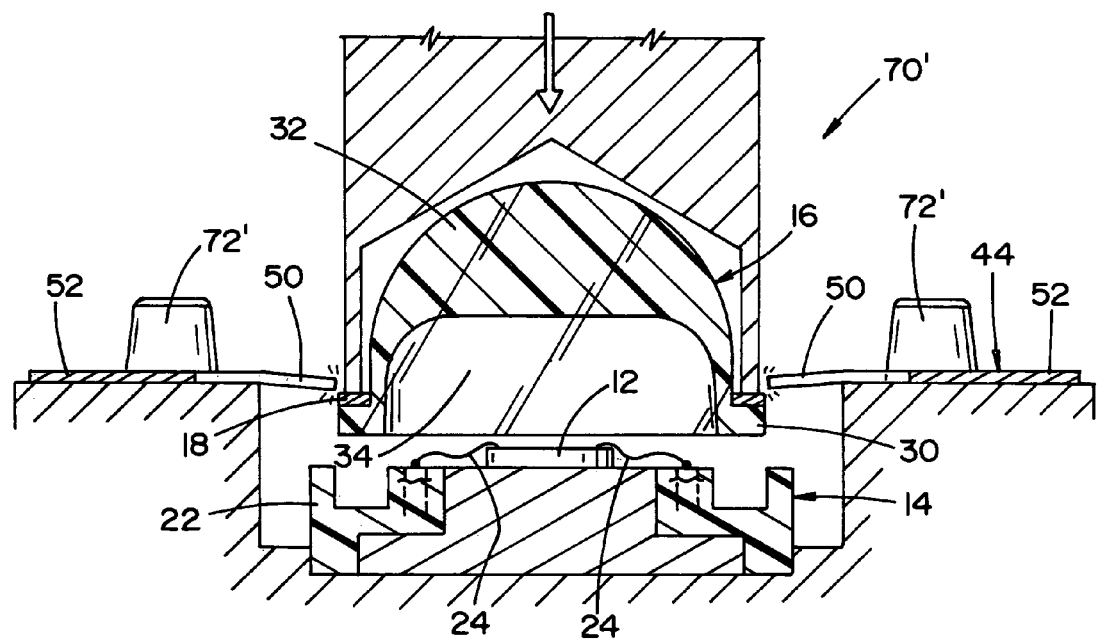
FIG. 12 is a partial cross-section schematic view of an alternate apparatus for removing a single lens assembly from the leadframe material and encapsulating an LED with the lens assembly.

In accordance with another embodiment, with reference to FIG. 12, an apparatus 70' can be used in place of the apparatus 70. The apparatus 70' is a press-type device that uses a single motion to sever the support frame 18 from its supports 50 and place the cover 16 with its severed support frame 18 onto base 14 to encapsulate LED 12. Pins 72' can be used in the recesses 54 to position the support frame 18 relative to the apparatus 70'. With a downward stroke, the apparatus 70' removes each cover 16 from the strip 44 and places it on a base 14.

The invention has been described with reference to the preferred embodiment(s). Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A lens cover assembly for covering a light emitting diode received in an open package, comprising:
    a lens cover having a base portion and a dome portion integrally formed with said base portion, said dome portion being at least partially optically transmissive to allow light from the light emitting diode to pass therethrough; and
    a support frame reinforcing said base portion of said lens cover for providing structural integrity to said lens cover.

2. The lens cover assembly of claim 1 wherein said support frame is a ring disposed on said base portion.

3. The lens cover assembly of claim 2 wherein said lens cover is formed of a relatively soft material and said support frame is stainless steel.

4. The lens cover assembly of claim 3 wherein said lens cover is formed of a silicone material.

5. The lens cover assembly of claim 1 wherein said support frame is entirely encased within said base portion of said lens cover.

6. The lens cover assembly of claim 1 further including a base supporting an LED thereon, said base and said light emitting diode together forming the open package to which said lens cover is attached to protect said light emitting diode.

7. The lens cover assembly of claim 1 wherein said base portion extends radially outwardly from said dome portion.

8. The lens cover assembly of claim 7 wherein said support frame is annularly received around said dome portion and against an upper surface of said radially extending base portion.

9. The lens cover assembly of claim 7 wherein said support frame is encapsulated entirely by said radially extending base portion.

10. The lens cover assembly of claim 1 wherein said support frame is formed of stainless steel and is positioned adjacent said base portion.

11. The lens cover assembly of claim 1 wherein said base portion of said lens cover is overmolded on said support frame.

12. The lens cover assembly of claim 11 wherein said support frame is stainless steel and said lens cover is silicone, said silicone lens cover overmolded on said stainless steel support frame.

13. A light emitting diode (LED) assembly, comprising:
    an LED;
    an optically transmissive cover assembly encapsulating said LED, said cover assembly including an optically transmissive cover formed of a relatively soft material and a stiffener formed of a material that is relatively harder than said cover for providing dimensional stability to said cover; and
    a base for supporting said LED, said base having electrical leads extending therefrom that are electrically connected to said LED, said cover assembly received on said base.

14. The LED assembly of claim 13 further including:
    bond wires electrically connecting said LED and said electrical leads.

15. The LED assembly of claim 13 wherein said cover includes a dome portion and an annular base portion extending radially outwardly from an open end of said dome portion.

16. The LED assembly of claim 15 wherein said stiffener is annularly shaped and disposed in abutting relation with said annular base portion.

17. The LED assembly of claim 16 wherein said stiffener is entirely encased within said base portion of said cover.

18. The LED assembly of claim 16 wherein said stiffener is disposed against a top surface of said base portion.

19. The LED assembly of claim 15 wherein said cover is formed of silicone and said stiffener is formed of stainless steel, said stiffener being one of (i) positioned adjacent said annular base portion of said silicone cover and (ii) encased by said annular base portion of said cover.

20. The LED assembly of claim 13 wherein said stiffener is formed of stainless steel and said cover is formed of a silicone material that is overmolded onto said stainless steel stiffener.

21. A lens cover assembly for encapsulating a light emitting device received on a support base, said lens cover assembly comprising a dome portion having a cavity within which said light emitting device resides, said lens cover assembly further comprising a base portion formed integrally with said dome portion and extending radially outwardly from an open end of said dome portion, said base portion engaged with the support base to encapsulate the light emitting diode received thereon, a support frame formed of a material relatively harder than said dome portion and said base portion, said support frame being overmolded by said dome portion and said base portion to provide increased dimensional stability to said dome portion and said base portion.

* * * * *